United States Patent
Sinclair et al.

(10) Patent No.: US 10,866,503 B1
(45) Date of Patent: Dec. 15, 2020

(54) LOW EMISSION IMPLANTATION MASK AND SUBSTRATE ASSEMBLY

(71) Applicant: APPLIED Materials, Inc., Santa Clara, CA (US)

(72) Inventors: Frank Sinclair, Boston, MA (US); Julian G. Blake, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/522,982

(22) Filed: Jul. 26, 2019

(51) Int. Cl.
G03F 1/22 (2012.01)
H01L 21/027 (2006.01)
G03F 1/60 (2012.01)
H01L 21/265 (2006.01)

(52) U.S. Cl.
CPC ............... *G03F 1/22* (2013.01); *G03F 1/60* (2013.01); *H01L 21/027* (2013.01); *H01L 21/26586* (2013.01)

(58) Field of Classification Search
None
See application file for complete search history.

(56) References Cited

U.S. PATENT DOCUMENTS

| 6,608,315 | B1 | 8/2003 | Saadatmand et al. |
| 2009/0041197 | A1 | 2/2009 | Clayton |
| 2010/0184243 | A1 | 7/2010 | Low et al. |
| 2010/0247884 | A1* | 9/2010 | Watanabe ......... H01L 21/02444 428/216 |
| 2012/0292285 | A1 | 11/2012 | Kontos et al. |
| 2015/0235864 | A1 | 8/2015 | Vogt et al. |
| 2015/0362265 | A1* | 12/2015 | Broido ................. F16D 69/00 361/710 |
| 2016/0335559 | A1* | 11/2016 | Pereverzev ......... H01L 39/2493 |

OTHER PUBLICATIONS

International Search Report dated Oct. 12, 2020, for the International Patent Application No. PCT/US2020/039168, filed on Jun. 23, 2020, 3 pages.
Written Opinion dated Oct. 12, 2020, for the International Patent Application No. PCT/US2020/039168, filed on Jun. 23, 2020, 5 pages.

* cited by examiner

*Primary Examiner* — J. E. Schoenholtz

(57) ABSTRACT

A substrate assembly may include a substrate base; and a low emission implantation mask, disposed on the substrate base. The low emission implantation mask may include a carbon-containing material, the carbon-containing material comprising an isotopically purified carbon, formed from a $^{12}C$ carbon isotope precursor.

20 Claims, 4 Drawing Sheets

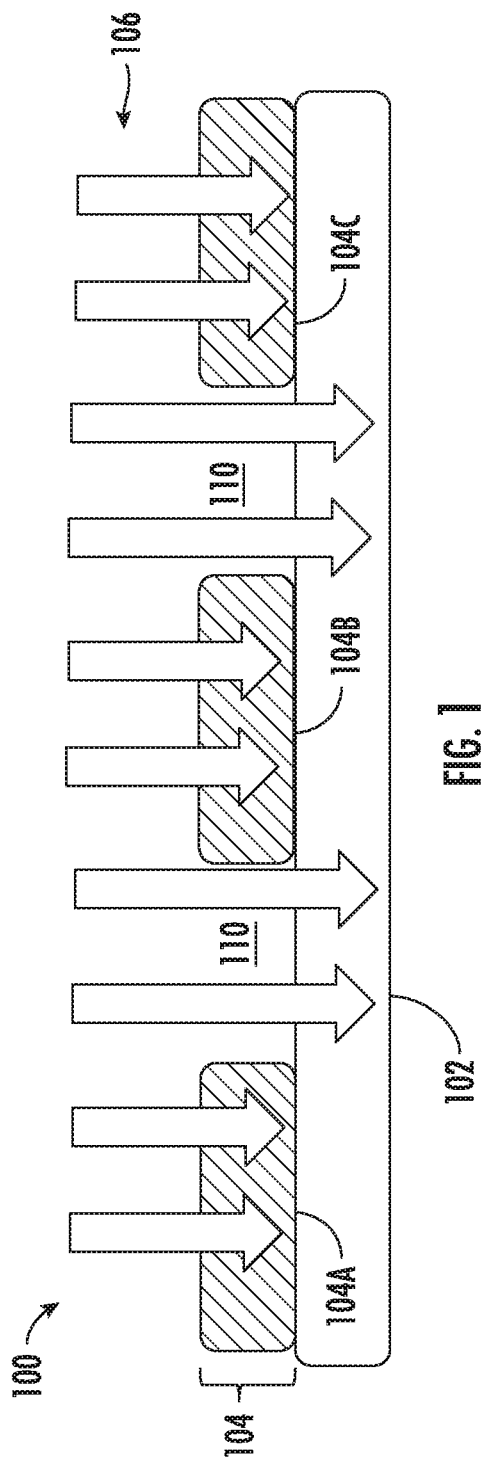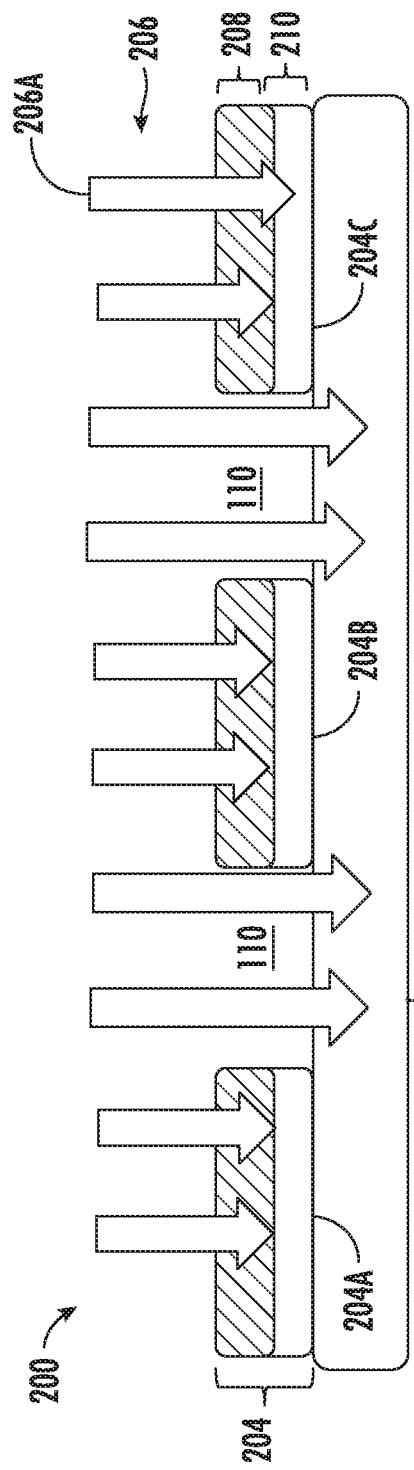

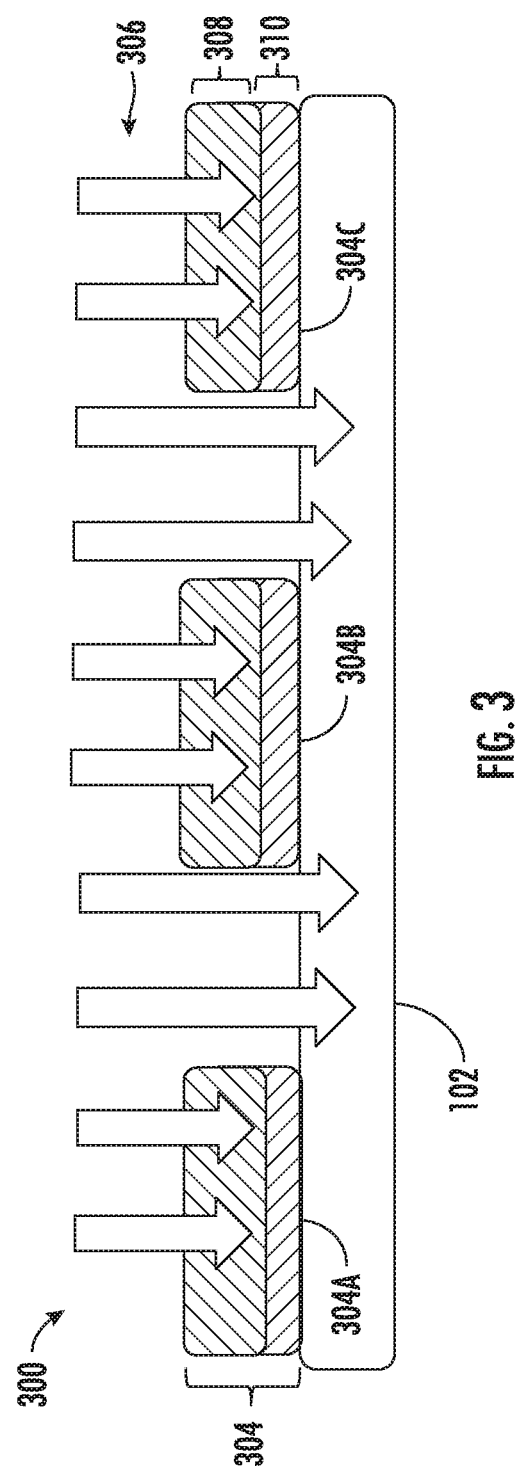

LOW EMISSION IMPLANTATION MASK AND SUBSTRATE ASSEMBLY

FIELD OF THE DISCLOSURE

The disclosure relates generally to ion implantation, and more particularly to implant masks for high energy ion implantation.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter employs a so-called tandem acceleration architecture where ions are accelerated through a first column to high energy, undergo charge exchange to change polarity, and then are accelerated to a second energy, approximately double the first energy in a second column. Another type of high energy ion implanter is termed linear accelerator, or LINAC, where a series of electrodes arranged as tubes conduct and accelerate the ion beam to increasingly higher energy along the succession of tubes, where the electrodes receive an RF voltage signal at radio frequencies.

When high energy ions strike a workpiece (also termed "substrate"), in addition to implantation of the ions, various species may be emitted from the workpiece, including secondary ions, electrons, as well as nuclear particles, such as neutrons. In many instances, patterned implantation is performed, where those regions of a substrate not to be implanted are masked. Exemplary mask materials, include photoresist, such as organic based photoresists, hard mask materials including carbon $SiO_2$, SiC, or other materials. Most of the common mask materials contain significant amounts of carbon (C). Elemental carbon includes a predominance of $^{12}C$ isotope with a naturally occurring fraction of approximately 1.1% $^{13}C$ isotope, as well as vary small trace amounts of $^{14}C$ isotope. The $^{13}C$ isotope, when struck with sufficiently energetic ions, may be transformed by nuclear reaction, leading to radioactive decay via a neutron emission mechanism.

Mask materials such as carbon-based (organic) photoresists, SiC, carbon mask materials, and the like, tend to incorporate $^{13}C$ isotope in a fraction similar to the naturally occurring percentage of 1.1%. Thus, known carbon-based mask materials are susceptible to neutron emission when struck with high energy ions, especially when ion energy is above 1 MeV, and increasingly likely when ion energy is above 2-3 MeV.

To absorb neutrons emitted in such a radioactive process, very thick cladding, such a high density polyethylene" or "borated polyethylene shield, may be necessary to install in an ion implanter, including in an implantation chamber housing substrates. In addition, neutron radiation may persist for some time, entailing the need for long "cooling off" periods before handling substrates after ion implantation.

With respect to these and other considerations, the present disclosure is provided.

BRIEF SUMMARY

In one embodiment, a substrate assembly may include a substrate base; and a low emission implantation mask, disposed on the substrate base, the low emission implantation mask comprising a carbon-containing material, the carbon-containing material comprising an isotopically purified carbon, formed from a $^{12}C$ carbon isotope precursor.

In an additional embodiment, a low emission implantation mask may include a photoresist layer, having a layer of thickness of 10 μm or more, wherein the photoresist layer comprises an isotopically purified carbon, formed from a $^{12}C$ carbon isotope. precursor.

In a further embodiment, a method of implanting a substrate may include providing a low emission implantation mask on the substrate, the low emission implantation mask comprising an isotopically purified $^{12}C$ material, the implant mask comprising an open region and a masked region, and having a first thickness. The method may include directing an ion species at the substrate at an implant energy, wherein the ion species implants into the substrate in the open region and does not implant into the substrate in the masked region. As such, the low emission implantation mask generates a first neutron yield, lower than a second neutron yield when the ion species are implanted into a regular implant mask, having the first thickness and comprising an isotopically impure carbon material.

BRIEF DESCRIPTION OF THE DRAWINGS

FIG. 1 shows an exemplary substrate arrangement for low neutron emission, according to embodiments of the disclosure;

FIG. 2 shows an exemplary substrate arrangement for low neutron emission, according to further embodiments of the disclosure;

FIG. 3 shows another substrate arrangement for low neutron emission, according to additional embodiments of the disclosure;

Figure 4:
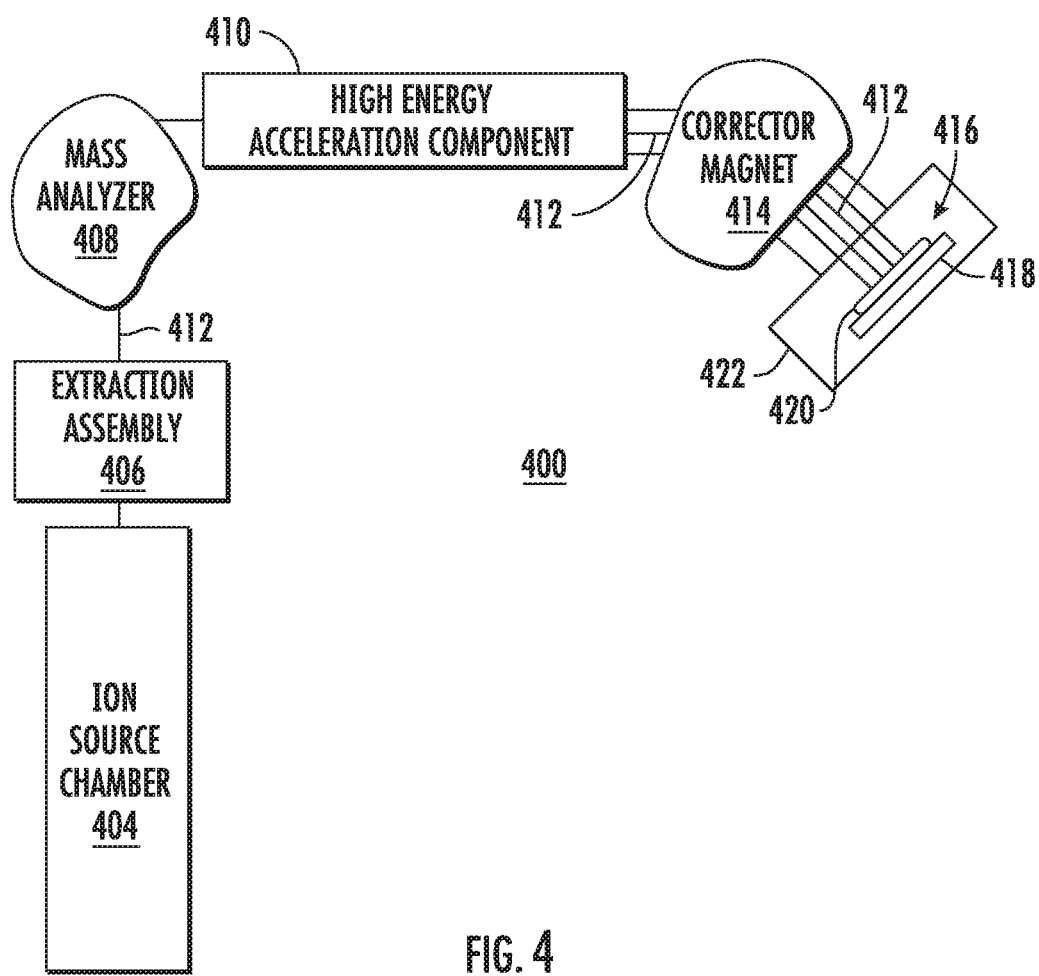
FIG. 4 shows an exemplary ion implanter arrangement, according to further embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved mask materials and substrate assemblies that exhibit lower neutron emission when exposed to high energy implantation. In various embodiments, mask materials and substrate assemblies are provided that employ a carbon based mask layer formed from isotopically purified $^{12}$C material. As used herein, the term "isotopically purified $^{12}$C material" may refer to a carbon-containing material where the $^{13}$C concentration as a function of total carbon concentration ($^{13}$C/($^{13}$C+$^{12}$C)) is less than 0.5%, such as less than 0.1%. In some cases, an isotopically purified $^{12}$C layer may contain unmeasureable $^{13}$C or contains less than a part per million (ppm) of $^{13}$C. Notably, any $^{13}$C concentration significantly less than the 1.1% natural ratio will produce a proportionate decrease in the neutron emission and thus may be described as "Isotopically purified $^{12}$C".

The present inventors have realized that, while many materials may exhibit neutron emission when exposed to high energy implantation, including both $^{12}$C and $^{13}$C, the neutron emission cross-section exhibits a different energy dependence for different materials. In particular, the present embodiments take advantage of the different energy dependence for neutron emission between $^{12}$C and $^{13}$C in the MeV range.

As an example, the cross-section for neutron emission from $^{13}$C exposed to a positive hydrogen ion (proton) is estimated to be below 10 microbarns at proton energies below 2 MeV. At proton energies above 2.5 MeV, the cross-section for neutron emission rapidly increases, reaching the range of 50-100 millibarns for ion energies in the range of 3 MeV to 10 MeV, and remaining at levels above 5 millibarns for ion energies up to 25 MeV. Similarly, for helium ions, the neutron emission cross section of $^{13}$C at energies below 500 keV is below 1 microbarn, while increasing rapidly above 1 MeV to reach levels of 1 millibarn or greater, and in particular, to reach levels in the tens of millibarns to hundreds of millibarns for ion energies between 2 MeV and 25 MeV, for example.

In contrast, the cross-section for neutron emission from $^{12}$C exposed to a positive hydrogen ion (proton) is estimated to be below 5 microbarns at proton energies below 2 MeV. The cross-section for neutron emission from $^{12}$C exposed to a positive hydrogen ion (proton) does not increase into the millibarn range until ion energy is above 15 MeV, reaching levels between 50-100 millibarns for ion energies in the range of 20 MeV to 100 MeV. Similarly, for helium ions, the neutron emission cross section of $^{12}$C at energies below 10 MeV is below 1 microbarn, while increasing rapidly above 11 MeV to reach levels of approximately 10 millibarn between 11 MeV and 25 MeV, for example.

Notably the ion energy range of 1 MeV to 10 MeV or so is characteristic of many implantation procedures for implanting hydrogen into silicon wafers, to name one commercial implementation. Accordingly, by providing masking materials formed of isotopically purified $^{12}$C, ion implantation processes performed in the MeV range, such as 1 MeV to approximately 15 MeV for proton implantation, and up to approximately 10 MeV for helium implantation, may be safely performed, with much lower yield of neutrons.

According to various embodiments of the disclosure, a photoresist material may be prepared using organic (carbon-containing) materials, where the carbon-containing materials may be formed of isotopically purified $^{12}$C carbon-containing chemicals. The photoresist materials may otherwise be prepared using known processes, such that the photoresist materials may be chemically the same as known photoresist materials, differing in that the carbon in the photoresist contains just $^{12}$C isotope (neglecting trace amounts, such as below 1 ppm, if any, of $^{14}$C or $^{13}$C). According to various embodiments, the isotopically purified $^{12}$C photoresist material may then be applied to a substrate as an implantation mask, in accordance with known procedures.

According to other embodiments of the disclosure, a carbon-containing hard mask layer may be formed on a substrate, where the carbon-containing hard mask layer may be formed of isotopically purified $^{12}$C carbon. In some embodiments, where the hardmask layer is deposited by chemical vapor deposition, an isotopically purified $^{12}$C precursor gas may be used to deposit the hardmask layer, such as $^{12}$CH$_4$, $^{12}$C$_2$H$_6$, where the superscript '12' denotes a given chemical or substance having the stated chemical formula where the carbon material in the given chemical or substance contains just the $^{12}$C isotope of carbon (neglecting trace amounts, such as below 1 ppm, if any, of $^{14}$C or $^{13}$C). As such, the isotopically purified $^{12}$C-containing hardmask layer, such as Si$^{12}$C, $^{12}$C, Si$^{12}$CN, and so forth, may be deposited by known CVD methods.

In other embodiments, the hardmask layer may be deposited by physical vapor deposition, including sputtering, evaporation, and so forth, using a solid target formed of a isotopically purified $^{12}$C carbon. As such, the hardmask layer, such as SiC, C, SiCN, and so forth, may be deposited by known PVD methods.

The isotopically purified $^{12}$C hardmask layer may be patterned according to known procedures to form a hardmask.

FIG. 1 shows an exemplary substrate arrangement for low neutron emission, according to embodiments of the disclosure. The substrate arrangement 100 is shown, where a substrate 102 supports an implantation mask 104. The implantation mask 104 is used to define an implantation pattern for ions to be implanted into the substrate 102. As such, when the ions, generally shown as an ion beam 106, impact the substrate arrangement 100, different portions of the implantation mask 104, shown as portion 104A, portion 104B, portion 104C, block the ion beam 106 from impinging on the substrate 102 in regions directly subjacent to the different portions. The ion beam 106 implants into the substrate 102 in open regions 110, where no mask material is present. According to embodiments of the disclosure, the implantation mask 104 may be a carbon-containing layer, formed of an isotopically purified $^{12}$C material, as discussed above. According to various embodiments, the implantation mask 104 is formed at a given mask thickness, where the mask thickness is adequate to prevent ions of ion beam 106 from traveling completely through the implantation mask 104 and striking the substrate 102, as suggested by the extent of the arrows. The thickness of implantation mask 104 may be set according to the ion energy and ion species to implant into the substrate 102. Exemplary thicknesses of implantation mask 104 may range between several micrometers to several hundred micrometers (m) for use in implantation procedures, where ion energies are set in the range of 1 MeV-10 MeV, and where ion species are protons or helium. The embodiments are not limited in this context. In some embodiments, the implantation mask 104 may be a photoresist mask, a stencil mask, or a hardmask. In some embodiments the implantation mask 104 may be formed in a single layer, where the layer is formed of an isotopically purified $^{12}C$ material.

Notably, in various use scenarios, the substrate arrangement 100 may be deployed in a high energy implanter, such as a tandem ion implanter or linear accelerator (LINAC) implanter, where ions of the ion beam 106 may impact the substrate at energies in the MeV range. For example, the ion energy for ion beam 106 may be 1 MeV to 10 MeV in various non-limiting embodiments. When impacting implantation mask 104, the neutron yield generated by ions of ion beam 106 may be suppressed, due to the absence of $^{13}C$ in carbon species of the implantation mask 104. Notably, for 1-10 MeV positive hydrogen ions (protons) or 1-10 MeV helium ions, the neutron emission by implantation mask 104 may be suppressed with respect to a known mask having the same chemical composition as implantation mask 104, where in known mask the $^{13}C$ isotope is present in carbon species at a natural abundance of approximately 1.1%.

FIG. 2 shows another exemplary substrate arrangement for low neutron emission, according to embodiments of the disclosure. The substrate arrangement 200 is shown, where a substrate 102 supports an implantation mask 204. As in FIG. 1, the implantation mask 204 is used to define an implantation pattern for ions to be implanted into the substrate 102. As such, when the ions, generally shown as an ion beam 206, impact the substrate arrangement 200, different portions of the implantation mask 204, shown as portion 204A, portion 204B, portion 204C, block the ion beam 206 from impinging on the substrate 102 in regions directly subjacent to the different portions.

According to embodiments of the disclosure, the implantation mask 204 may be formed of multiple layers, including at least one carbon-containing layer, formed of an isotopically purified $^{12}C$ material, generally as discussed above. As suggested in FIG. 2, the implantation mask 204 may include two layers, including an outer layer, shown as upper layer 208 and a lower layer 210. The upper layer 208 may have an upper interface with ambient, where the ion beam 206 implants into the upper layer 208. As such, the upper layer 208 may be a carbon-containing layer, formed of an isotopically purified $^{12}C$ material. As with implantation mask 104, the thickness of the upper layer 208 may be set according to the ion species and ion energy for ion beam 206, so as to contain the ion beam 206 within the upper layer 208. In this manner, the lower layer 210 may be formed of a different material than upper layer 208. For example, the implantation mask 204 may be a chemically homogeneous set of layers, such as a set of two carbon-containing photoresist layers, where the upper layer 208 and the lower layer 210 have the same chemical composition. The lower layer 210 may differ from the upper layer 208 in that the lower layer 210 is formed of carbon species where the ratio of $^{13}C$ to $^{12}C$ is similar or the same as the natural abundance of 1.1%. As such, the lower layer 210 may exhibit a much higher neutron emission than the neutron emission of the upper layer 208, when subject to irradiation of ions such as protons or helium having energy in the range of 1 MeV to 10 MeV. The use of the lower layer 210 in implantation mask 204 facilitates providing a relatively thicker mask, where just a portion of the mask is formed of a relatively more expensive layer formed from isotopically purified $^{12}C$. In other words, an isotopically purified $^{12}C$ mask material may be very expensive, so that using isotopically purified $^{12}C$ in just a top part of the mask may provide cost savings, while the lower part of the mask is made out of the chemically identical material, but having a naturally occurring isotopic composition of $^{13}C$. Such an arrangement has the advantage that both layers of the mask may be lithographically treated together (exposed, developed, hard baked, et cetera) in the same processes, while reducing the neutron emission of the mask at a minimum added cost.

In particular, the thickness of the upper layer 208 may be such that for a targeted implantation energy, some ions of ion beam 206 may completely traverse the upper layer 208 and penetrated into the lower layer 210, while no ions of ion beam 206 penetrate into the substrate 102 (206A). The thickness of the upper layer 208 may also be arranged wherein for the targeted implantation energy, the energy of ions of ion beam 206 will be below a threshold energy for generating significant amounts of neutrons from $^{13}C$, such as below 2.5 MeV for proton ion beams. Said differently, the presence of upper layer 208 at a sufficient thickness may allow the lower layer 210 to be formed from isotopically impure carbon, containing significant amounts of $^{13}C$, since the energy of any ions that do completely penetrate through upper layer 208 is sufficiently reduced as to be incapable of generating neutrons.

FIG. 3 shows another exemplary substrate arrangement for low neutron emission, according to embodiments of the disclosure. The substrate arrangement 300 is shown, where a substrate 102 supports an implantation mask 304. As in FIG. 1 and FIG. 2, the implantation mask 304 is used to define an implantation pattern for ions to be implanted into the substrate 102. As such, when the ions, generally shown as an ion beam 306, impact the substrate, different portions of the implantation mask 304, shown as portion 304A, portion 304B, portion 304C, block the ion beam 306 from impinging on the substrate 102 in regions directly subjacent to the different portions.

According to embodiments of the disclosure, the implantation mask 204 may be formed of multiple layers, including at least one carbon-containing layer, formed of an isotopically purified $^{12}C$ material, as discussed above. As suggested in FIG. 3, the implantation mask 304 may include two layers, including an upper layer 308 and a lower layer 310. The upper layer 308 may have an upper interface with ambient, where the ion beam 306 implants into the upper layer 308. As such, the upper layer 308 may be a carbon-containing layer, formed of an isotopically purified $^{12}C$ material. As with upper layer 208, the thickness of the upper layer 308 may be set according to the ion species and ion energy for ion beam 306, so as to contain the ion beam 306 within the upper layer 308, or to decelerate the ion beam 306 sufficiently to render the ion beam 306 incapable of generating neutrons, even when striking the lower layer 310. In this manner, the lower layer 310 may be formed of a different material than upper layer 308. Notably, in some embodiments, the lower layer 310 may be formed of a different material and/or a different process than upper layer 308. For example, the lower layer 310 may be hardmask material, while the upper layer 308 is a photoresist material.

FIG. 4 depicts an ion implantation system 400 arranged according to embodiments of the disclosure. The ion implantation system 400 may include an ion source 404, and extraction assembly 406, capable of generating an ion beam 412. The ion implantation system 400 may further include known components including a mass analyzer 408, for providing a mass analyzed beam by deflecting and filtering the ion beam 412. As illustrated in FIG. 4, the ion implantation system 400 may include a high energy acceleration component 410. The high energy acceleration component 410 may represent a known tandem accelerator or known linear accelerator, where the high energy acceleration component 410 is capable of accelerating the ion beam 412 to ion energies of 1 MeV or greater, such as up to 10 MeV, or up to 20 MeV in some embodiments. The ion implantation system 400 may further include a collimator 414 (which component may include a corrector magnet), end station 422, where a substrate assembly 416 is disposed in the end station 422. The substrate assembly 416 is shown as a substrate 418, including a low emission implantation mask 420, disposed on the substrate 418. The low emission implantation mask 420 is arranged as a carbon-containing mask, generally according to any of the aforementioned embodiments, where at least an upper layer of the low emission implantation mask 420 is formed of isotopically purified $^{12}$C material.

In operation, when the ion beam 412 strikes the substrate assembly 416 at energies, such as 1 MeV to 10 MeV, the neutron emission from substrate assembly 416 is suppressed in comparison to a known arrangement where the implantation mask includes carbon with substantial $^{13}$C fraction, such as a naturally occurring fraction in the range of 1.1% $^{13}$C.

Figure 5:
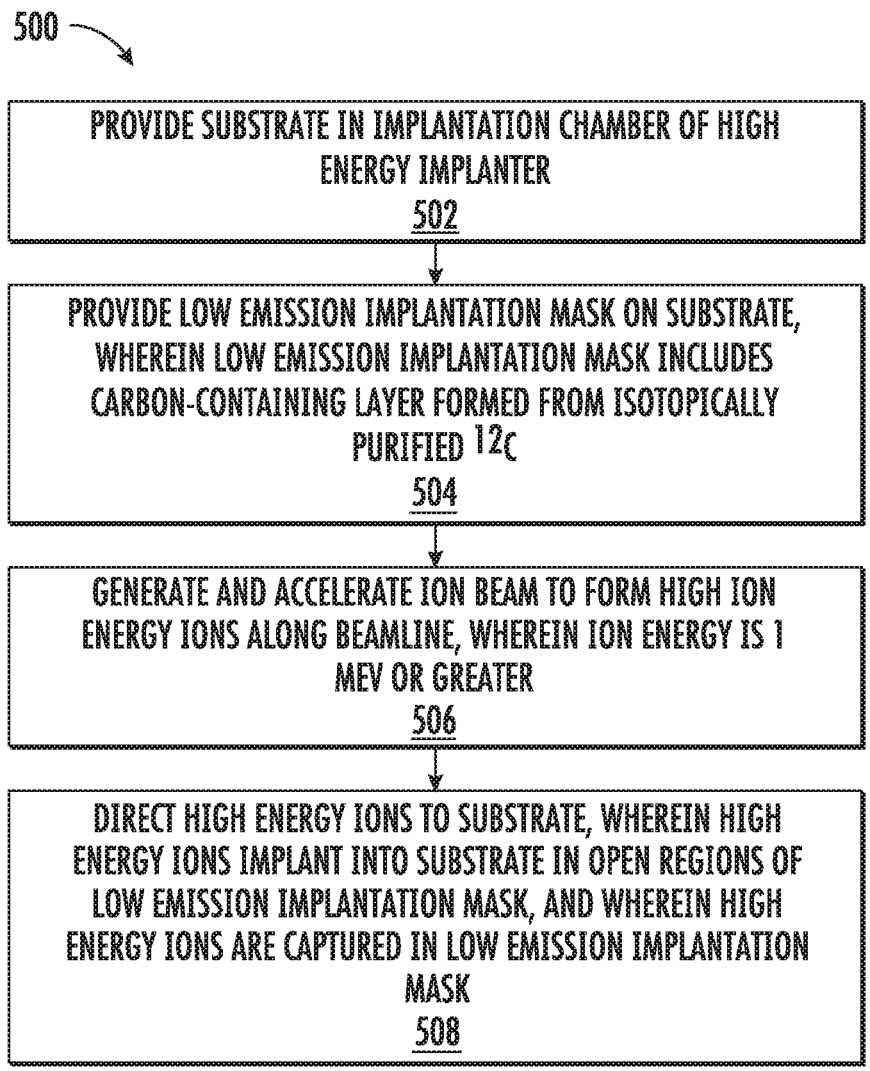
FIG. 5 depicts an exemplary process flow according to some embodiments of the disclosure.

FIG. 5 depicts an exemplary process flow 500 according to some embodiments of the disclosure. At block 502, a substrate is provided in an implantation chamber of a high energy ion implanter. At block 504, a low emission implantation mask is provided on the substrate. In various embodiments, the low emission implantation mask includes a carbon-containing layer formed from isotopically purified $^{12}$C, as described hereinabove. In some embodiments, the low emission implantation mask may be a single layer, while in other embodiments may include multiple layers.

At block 506 an ion beam is generated in the high energy ion implanter and the ion beam is accelerated to a high ion energy along the beamline. The high ion energy may range above 1 MeV, above 3 MeV, above 5 MeV, up to 10 MeV in various non-limiting embodiments. As an example, the ion implanter may be a tandem accelerator, arranged to accelerate hydrogen ions, helium ions, or other ions. The embodiments are not limited in this context. In additional embodiments, the ion implanter may be a linear accelerator, capable of accelerating ions to ion energy in the range of 1 MeV to 10 MeV. As such, after acceleration through a tandem accelerator or linear accelerator, the ion beam may emerge in a downstream portion of the beamline with the high energy, in the range of 1 MeV to 10 MeV.

At block 508 the high energy ions are directed to the substrate, wherein the high energy ions implant into the substrate in open regions of the low emission implantation mask, and wherein the high energy ions are captured in the low emission implantation mask. As such, during the implantation process, the neutron yield may be suppressed in comparison to scenarios where a known implantation mask that is chemically similar to the low implantation mask is used, where the known implantation mask is formed from carbon that is isotopically impure, where an abundance of $^{13}$C may be present, such as in the range of 1.1 atomic %.

In view of the foregoing, at least the following advantages are achieved by the embodiments disclosed herein. For a first advantage, by providing an isotopically purified $^{12}$C-containing low emission implantation mask on a substrate, neutron emission may be reduced during ion implantation at energies in the MeV range, such as between approximately 1 MeV and 10 MeV or so. As a second advantage, substrate handling after high energy implantation may be improved, since a "cooling off" period after implantation may be avoided, where post implantation neutron emission may be avoided, such as that emission generated after high energy implantation into a carbon-containing mask formed with a ~1% fraction of $^{13}$C isotopes.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. A substrate assembly, comprising:
   a substrate base; and
   a low emission implantation mask, disposed on the substrate base, the low emission implantation mask comprising a carbon-containing material, the carbon-containing material comprising an isotopically purified carbon, formed from a $^{12}$C carbon isotope precursor.

2. The substrate assembly of claim 1, the low emission implantation mask characterized by a $^{13}$C carbon isotope concentration less than 0.5%.

3. The substrate assembly of claim 1, the low emission implantation mask characterized by a $^{13}$C carbon isotope concentration less than 0.1%.

4. The substrate assembly of claim 1, the low emission implantation mask comprising an outer layer formed of isotopically purified $^{12}$C, and a lower layer, subjacent the outer layer, formed of isotopically impure carbon.

5. The substrate assembly of claim 1, the low emission implantation mask comprising a thickness of at least 10 μm.

6. The substrate assembly of claim 4, the outer layer comprising a thickness of at least 10 μm.

7. The substrate assembly of claim 1, the low emission implantation mask comprising a photoresist material or a hardmask material.

8. A low emission implantation mask, comprising:
   a photoresist layer, having a layer of thickness of 10 μm or more, wherein the photoresist layer comprises an isotopically purified carbon, formed from a $^{12}$C carbon isotope precursor.

9. The low emission implantation mask of claim 8, the photoresist layer characterized by a $^{13}$C carbon isotope concentration less than 0.5%.

10. The low emission implantation mask of claim 8, the photoresist layer characterized by a $^{13}$C carbon isotope concentration less than 0.1%.

11. The low emission implantation mask of claim 8, the photoresist layer comprising an outer layer formed of isotopically purified $^{12}$C, and a lower layer, subjacent the outer layer, formed of isotopically impure carbon.

12. A method of implanting a substrate, comprising:
providing a low emission implantation mask on the substrate, the low emission implantation mask comprising an isotopically purified $^{12}C$ material, the implant mask comprising an open region and a masked region, and having a first thickness; and
directing an ion species at the substrate at an implant energy,
wherein the ion species implants into the substrate in the open region and does not implant into the substrate in the masked region,
and wherein the low emission implantation mask generates a first neutron yield, lower than a second neutron yield when the ion species are implanted into a regular implant mask, having the first thickness and comprising an isotopically impure carbon material.

13. The method of claim 12, the low emission implantation mask characterized by a $^{13}C$ carbon isotope concentration less than 0.5%.

14. The method of claim 12, the low emission implantation mask characterized by a $^{13}C$ carbon isotope concentration less than 0.1%.

15. The method of claim 12, the low emission implantation mask comprising an outer layer formed of isotopically purified $^{12}C$, and a lower layer, subjacent the outer layer, formed of isotopically impure carbon.

16. The method of claim 12, the low emission implantation mask comprising a photoresist material or a hardmask material.

17. The method of claim 12, wherein the implant energy is between 100 keV and 10 MeV.

18. The method of claim 12, wherein the implant energy is above 1 MeV.

19. The method of claim 12, the implanting comprising:
accelerating the ion species as an ion beam, to a high ion energy along a beamline of an ion implanter.

20. The method of claim 19, the ion implanter comprising a linear accelerator or a tandem accelerator.

* * * * *